United States Patent
Chanemougame et al.

(10) Patent No.: US 10,381,354 B2
(45) Date of Patent: Aug. 13, 2019

(54) CONTACT STRUCTURES AND METHODS OF MAKING THE CONTACT STRUCTURES

(71) Applicant: GLOBALFOUNDRIES Inc., Grand Cayman (KY)

(72) Inventors: Daniel Chanemougame, Niskayuna, NY (US); Emilie Bourjot, Cohoes, NY (US)

(73) Assignee: GLOBALFOUNDARIES Inc., Grand Cayman (KY)

( * ) Notice: Subject to any disclaimer, the term of this patent is extended or adjusted under 35 U.S.C. 154(b) by 19 days.

(21) Appl. No.: 15/861,161

(22) Filed: Jan. 3, 2018

(65) Prior Publication Data

US 2019/0206878 A1 Jul. 4, 2019

(51) Int. Cl.
| | | |
|---|---|---|
| H01L 27/11 | (2006.01) | |
| H01L 29/78 | (2006.01) | |
| H01L 23/522 | (2006.01) | |
| H01L 23/528 | (2006.01) | |
| H01L 29/417 | (2006.01) | |

(52) U.S. Cl.
CPC ...... *H01L 27/1104* (2013.01); *H01L 23/5226* (2013.01); *H01L 23/5283* (2013.01); *H01L 29/41741* (2013.01); *H01L 29/7827* (2013.01)

(58) Field of Classification Search
CPC ............ H01L 27/1104; H01L 23/5283
See application file for complete search history.

(56) References Cited

U.S. PATENT DOCUMENTS

| | | | |
|---|---|---|---|
| 8,754,481 B2 | 6/2014 | Masuoka et al. | |
| 9,871,103 B2 | 1/2018 | Kim et al. | |
| 2004/0061153 A1 | 4/2004 | Misewich et al. | |
| 2004/0113207 A1 | 6/2004 | Hsu et al. | |
| 2006/0017119 A1 | 1/2006 | Jin et al. | |
| 2007/0075359 A1 | 4/2007 | Yoon et al. | |
| 2008/0179693 A1 | 7/2008 | Kim et al. | |
| 2008/0203493 A1 | 8/2008 | Yasuda | |
| 2010/0203714 A1 | 8/2010 | Masuoka et al. | |
| 2014/0003133 A1 | 1/2014 | Lin et al. | |
| 2015/0318288 A1 | 11/2015 | Lim et al. | |

(Continued)

OTHER PUBLICATIONS

Chung et al., "Novel 4F2 DRAM Cell with Vertical Pillar Transistor (VPT)," 2011 IEEE, pp. 211-214.

(Continued)

*Primary Examiner* — Farun Lu
(74) *Attorney, Agent, or Firm* — Amerson Law Firm, PLLC

(57) ABSTRACT

One illustrative IC product disclosed herein includes a first merged doped source/drain region that includes first and second doped regions and an isolation structure positioned adjacent the first doped region. In this example, the product also includes a contact structure positioned adjacent the isolation structure, wherein the contact structure includes a first portion positioned below an upper surface of the first merged doped source/drain region and a second portion positioned above the upper surface, wherein the first portion physically contacts both the first and second doped regions. The product also includes a layer of insulating material positioned on and in physical contact with a portion of an upper surface of the first portion of the contact structure.

20 Claims, 15 Drawing Sheets

(56) References Cited

U.S. PATENT DOCUMENTS

2016/0133633 A1    5/2016   Liaw
2017/0256548 A1*   9/2017   Hsu .................. H01L 27/1104
2017/0287905 A1   10/2017   Morrow et al.

OTHER PUBLICATIONS

Huynh-Bao et al., "Toward the 5nm Technology: Layout Optimization and Performance Benchmark for Logic/SRAMs Using Lateral and Vertical GAA FETs".

Huynh-Bal et al., "A Comprehensive Benchmark and Optimization of 5-nm Lateral and Vertical GAA 6T-SRAMs," IEEE Transactions on Electron Devices, 63:643-51, Feb. 2016.

Sharma et al., "SRAM Design for Wireless Sensor Networks, Chapter 2 SRAM Bit Cell Optimization," Springer, 2013.

Office Action from related U.S. Appl. No. 15/804,556 dated Jul. 18, 2018.

Notice of Allowance from related U.S. Appl. No. 15/813,471 dated Jul. 5, 2018.

\* cited by examiner

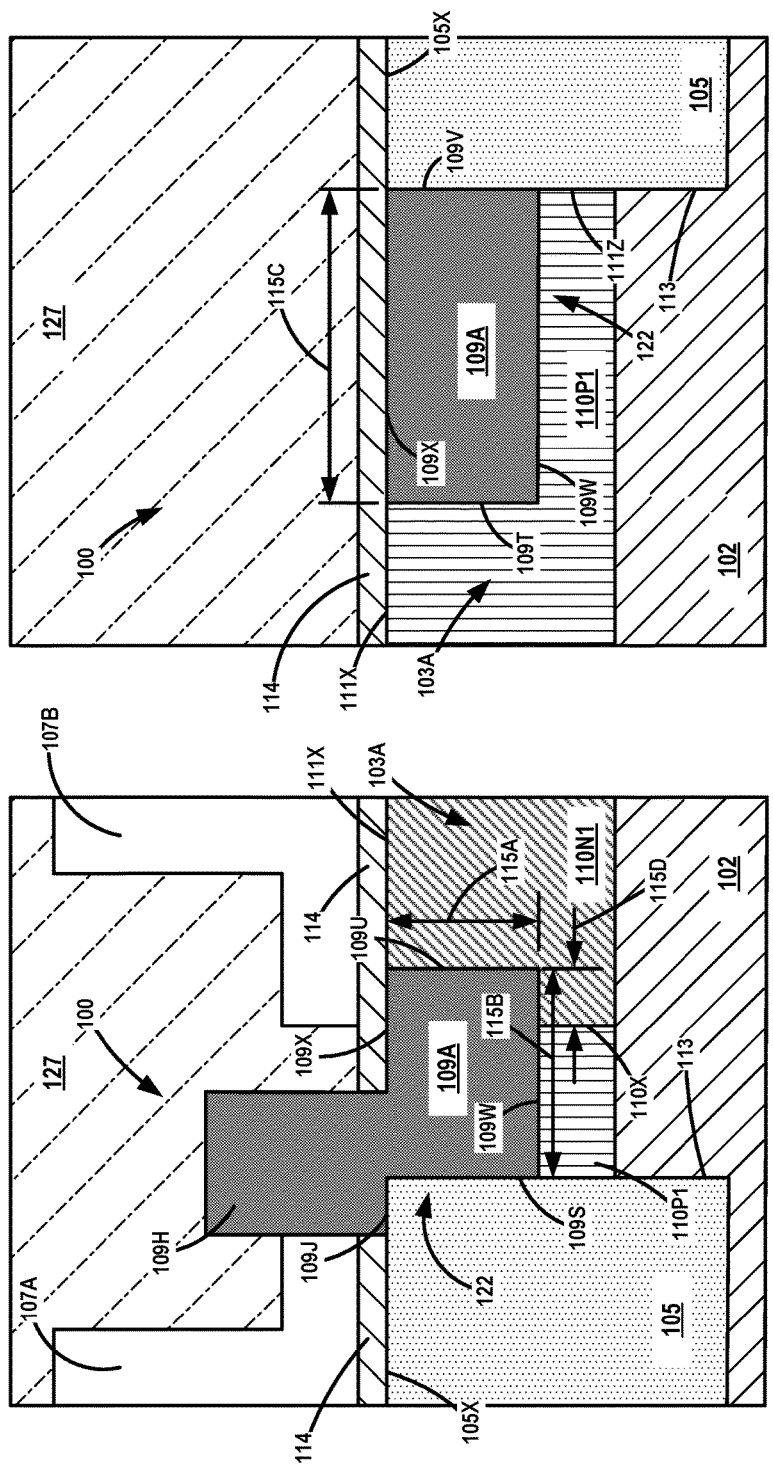

CONTACT STRUCTURES AND METHODS OF MAKING THE CONTACT STRUCTURES

BACKGROUND OF THE INVENTION

1. Field of the Invention

The present disclosure generally relates to the fabrication of semiconductor devices, and, more particularly, to various embodiments of a contact structure and various methods of making the contact structures.

2. Description of the Related Art

In general, memory devices are the means by which electronic information is stored. There are many types of memory devices, SRAMs (Static Random Access Memory), DRAMs (Dynamic Random Access Memory), ROMs (Read Only Memory), etc., each of which has its own advantages and disadvantages relative to other types of memory devices. For example, SRAMs are typically employed in applications where higher speed and/or reduced power consumption is important, e.g., cache memory of a microprocessor, mobile phones and other mobile consumer products, etc. Millions of such memory devices are typically included in even very basic electronic consumer products. Irrespective of the type of memory device, there is a constant drive in the industry to increase the performance and durability of such memory devices. In typical operations, an electrical charge (HIGH) is stored in the memory device to represent a digital "1", while the absence of such an electrical charge or a relatively low charge (LOW) stored in the device indicates a digital "0". Read/write circuitry is used to access the memory device to store digital information on such a memory device and to determine whether or not a charge is presently stored in the memory device. These read/write cycles typically occur millions of times for a single memory device over its effective lifetime.

FIG. 1 depicts a typical prior art configuration of a 6T (six-transistor) SRAM memory cell 10 that includes two CMOS-based inverters—INV1 and INV2. In general, the SRAM cell 10 includes two NMOS pass gate transistors PG1, PG2, two PMOS pull-up transistors PU1, PU2, and two NMOS pull-down transistors PD1, PD2. Each of the PMOS pull-up transistors PU1, PU2 has its gate (14A, 14B, respectively) connected to the gate (16A, 16B, respectively) of a corresponding NMOS pull-down transistor PD1, PD2. The PMOS pull-up transistors PU1, PU2 have their drain regions (D) connected to the drain regions of corresponding NMOS pull-down transistors PD1, PD2 to form the inverters INV1 and INV2, each of which have a conventional configuration. The source regions (S) of the PMOS pull-up transistors PU1, PU2 are connected to a high reference potential, typically Vdd. The source regions (S) of the NMOS pull-down transistors PD1, PD2 are connected to a lower reference potential, typically Vss or ground. The PMOS pull-up transistor PU1 and the NMOS pull-down transistor PD1 make up the first inverter INV1 of the SRAM cell 10. The PMOS pull-up transistor PU2 and the NMOS pull-down transistor PD2 make up the second inverter INV2 of the SRAM cell 10. The main function of an inverter is to invert the input signal applied to its input, i.e., an inverter circuit outputs a voltage representing the opposite logic-level to the voltage applied to its input. If the applied input voltage is logically low, then the output voltage becomes high and vice versa.

The gate 14A of the PMOS pull-up transistor PU1 and the gate 16A of the NMOS pull-down transistor PD1 are cross-coupled (i.e., connected) to the drain regions (D) of the transistors PU2, PD2 of the other inverter at node N2. Similarly, the gate 14B of the PMOS pull-up transistor PU2 and the gate 16B of the NMOS pull-down transistor PD2 are cross-coupled (i.e., connected) to the drain regions (D) of the transistors PU1, PD1 at node N1. Hence, the potential present on the drain regions of the transistors PU1, PD1 (node N1) of the first inverter is applied to the gates of transistors PU2, PD2 of the second inverter and the charge serves to keep the second inverter in an ON or OFF state. The logically opposite potential is present on the drain regions of the transistors PU2, PD2 (node N2) of the second inverter and on the gates of the transistors PU1, PD1 of the first inverter, keeping the first inverter in the complementary OFF or ON state relative to the second inverter. Thus, the latch of the illustrated SRAM cell 10 has two stable states: a first state with a predefined potential present on charge storage node N1 and a low potential on charge storage node N2; and a second state with a low potential on charge storage node N1 and the predefined potential on charge storage node N2. Binary data are recorded by toggling between the two states of the latch. Sufficient charge must be stored on the charge storage node, and thus on the coupled gates of the associated inverter, to unambiguously hold one of the inverters "ON" and unambiguously hold the other of the inverters "OFF", thereby preserving the memory state. The stability of an SRAM cell 10 can be quantified by the margin by which the potential on the charge storage nodes can vary from its nominal value while still keeping the SRAM 10 cell in its original state. In manufacturing such an SRAM cell 10, a conductive contact structure must be formed to cross-couple (or conductively couple) a shared drain region on the first inverter with a gate structure of the second inverter.

The present disclosure is directed to various embodiments of a contact structure and various methods of making such contact structures.

SUMMARY OF THE INVENTION

The following presents a simplified summary of illustrative embodiments of the invention in order to provide a basic understanding of some aspects of the illustrative embodiments of the invention. This summary is not an exhaustive overview of the illustrative embodiments of the invention specifically discussed herein. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of a contact structure and various methods of making such contact structures. One illustrative IC product disclosed herein includes a first merged doped source/drain region that includes first and second doped regions that interface with one another within the first merged doped source/drain region and an isolation structure positioned adjacent the first doped region. In this example, the product also includes a contact structure positioned adjacent the isolation structure, wherein the contact structure includes a first portion positioned below an upper surface of the first merged doped source/drain region and a second portion positioned above the upper surface, wherein the first portion physically contacts both the first doped region and the second doped region. In this example, the product also includes a layer of insulating material positioned on and in physical contact with a portion of an upper surface of the first portion of the contact structure.

One illustrative method disclosed herein includes forming a first merged doped source/drain region in a semiconductor material, the first merged doped source/drain region including first and second doped regions intersecting one another along an interface within the first merged doped source/drain region, forming a layer of insulating material on and in physical contact with an upper surface of the first merged doped source/drain region and forming an opening in the layer of insulating material, wherein the opening exposes a portion of an isolation structure located adjacent the first doped region and at least a portion of an upper surface of the first doped region of the first merged doped source/drain region. In this example, the method also includes forming a contact trench in the first merged doped source/drain region by performing a first anisotropic etching process to remove at least a first portion of the first doped region and performing a second isotropic etching process to remove at least an additional second portion of the first doped region so as to form the contact trench that at least exposes the second doped region positioned under the layer of insulating material. In this example, the method also includes forming a contact structure having a first portion positioned within the contact trench below the upper surface of the first merged doped source/drain region and a second portion that extends above the upper surface of the first merged doped source/drain region, wherein the first portion of the contact structure physically engages both the first and second doped regions.

BRIEF DESCRIPTION OF THE DRAWINGS

The disclosure may be understood by reference to the following description taken in conjunction with the accompanying drawings, in which like reference numerals identify like elements, and in which:

FIGS. 2-16 are various views that depict various embodiments of a contact structure and various methods of making such contact structures.

Figure 1:
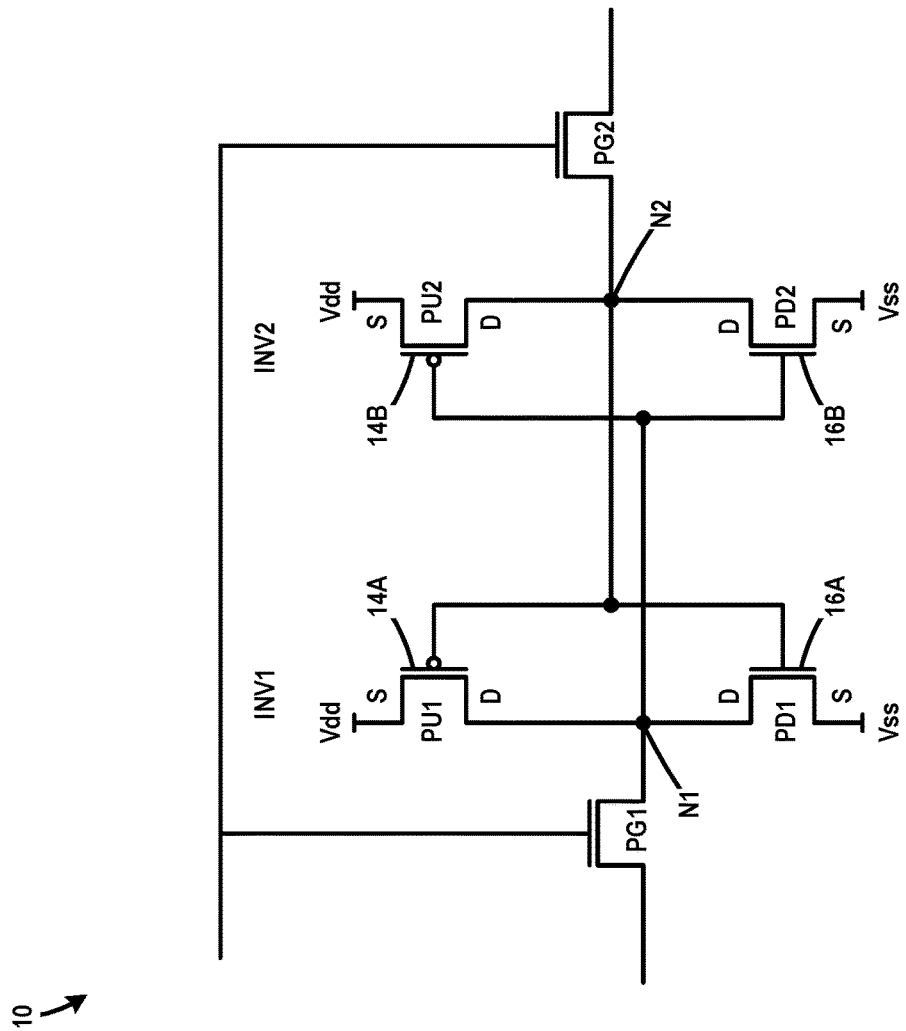
FIG. 1 is an electrical schematic of an illustrative prior art SRAM cell that includes two CMOS-based inverters.

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The various layers of material described below may be formed by any of a variety of different known techniques, e.g., a chemical vapor deposition (CVD) process, an atomic layer deposition (ALD) process, a thermal growth process, epitaxial growth processes, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 2-16 are various views that depict various embodiments of a contact structure 109 and various methods of making such contact structures. The presently disclosed illustrative embodiments of the inventions will be discussed in the context where the contact structures 109 disclosed herein may be formed on an illustrative six-transistor (6T) SRAM cell. However, as will be appreciated by those skilled in the art after a complete reading of the present application, the contact structures 109 disclosed herein may be employed in applications other than the depicted SRAM cell. Thus, the presently disclosed inventions should not be considered to be limited to the illustrative SRAM application disclosed herein.

Figure 2:
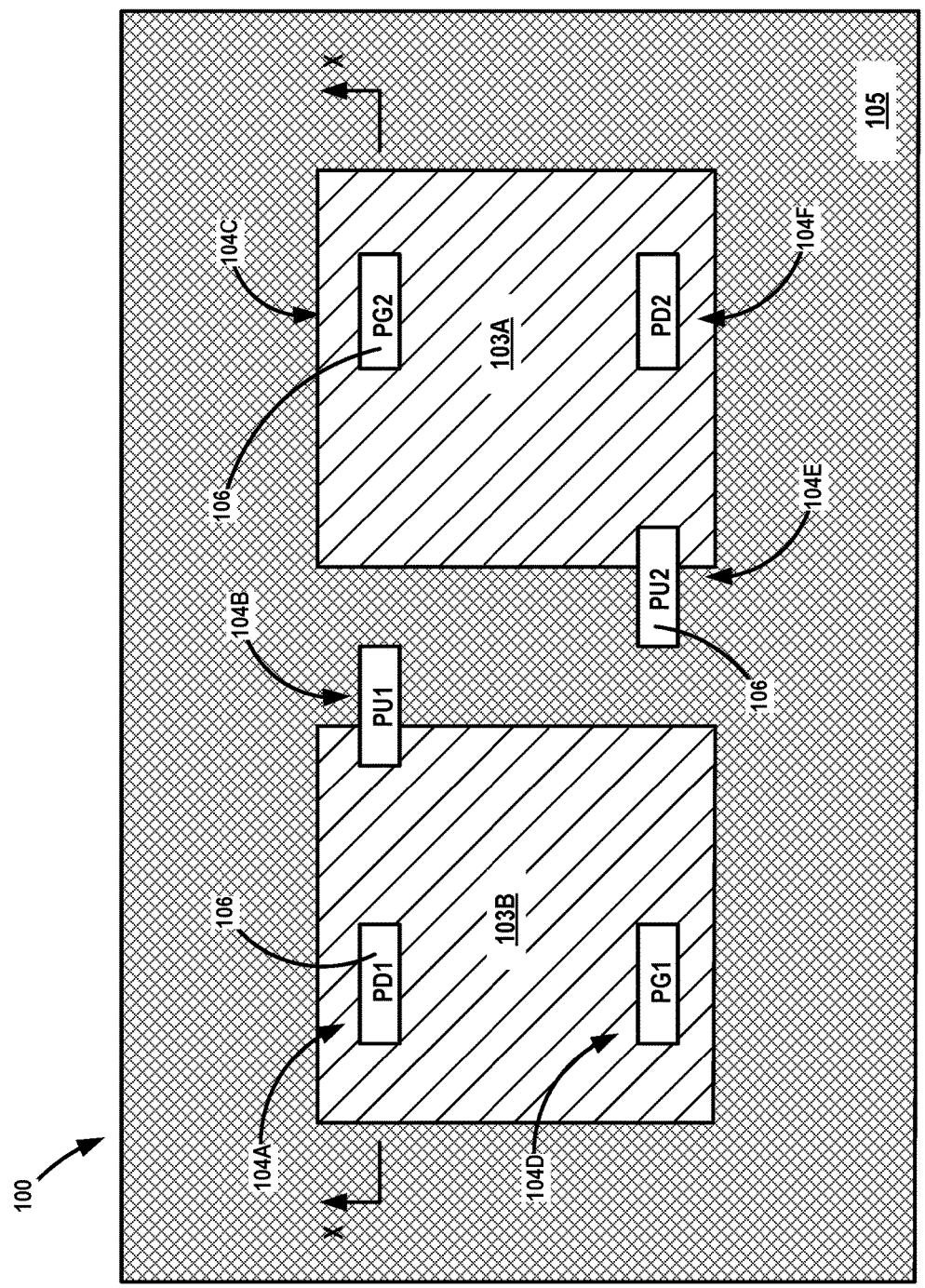

FIG. 2 is a simplistic plan view of an embodiment of an IC product 100 that includes an illustrative SRAM cell. The SRAM cell 100 includes six illustrative and schematically depicted vertical transistor devices 104A-104F (generally referenced using the numeral 104) that are formed above an illustrative semiconductor substrate 102 (see FIG. 8). In general, the IC product 100 includes two NMOS pass gate transistors PG1 (104D), PG2 (104C), two PMOS pull-up transistors PU1 (104B), PU2 (104E), and two NMOS pull-down transistors PD1 (104A), PD2 (104F). Each of the vertical transistors 104 includes a simplistically depicted vertically oriented channel semiconductor (VOCS) structure 106. However, as will be appreciated by those skilled in the art, the drawings provided herein depict the formation of the contact structures 109 at a given point in the process flow disclosed herein. It should be understood that these drawings are not intended to, nor do they, show the full, final formation of functional vertical transistor devices 104. For example, each of the vertical transistor devices 104 would include a top source/drain region (not shown). However, such details regarding the formation of fully functional vertical transistor devices have been omitted.

Figure 3:
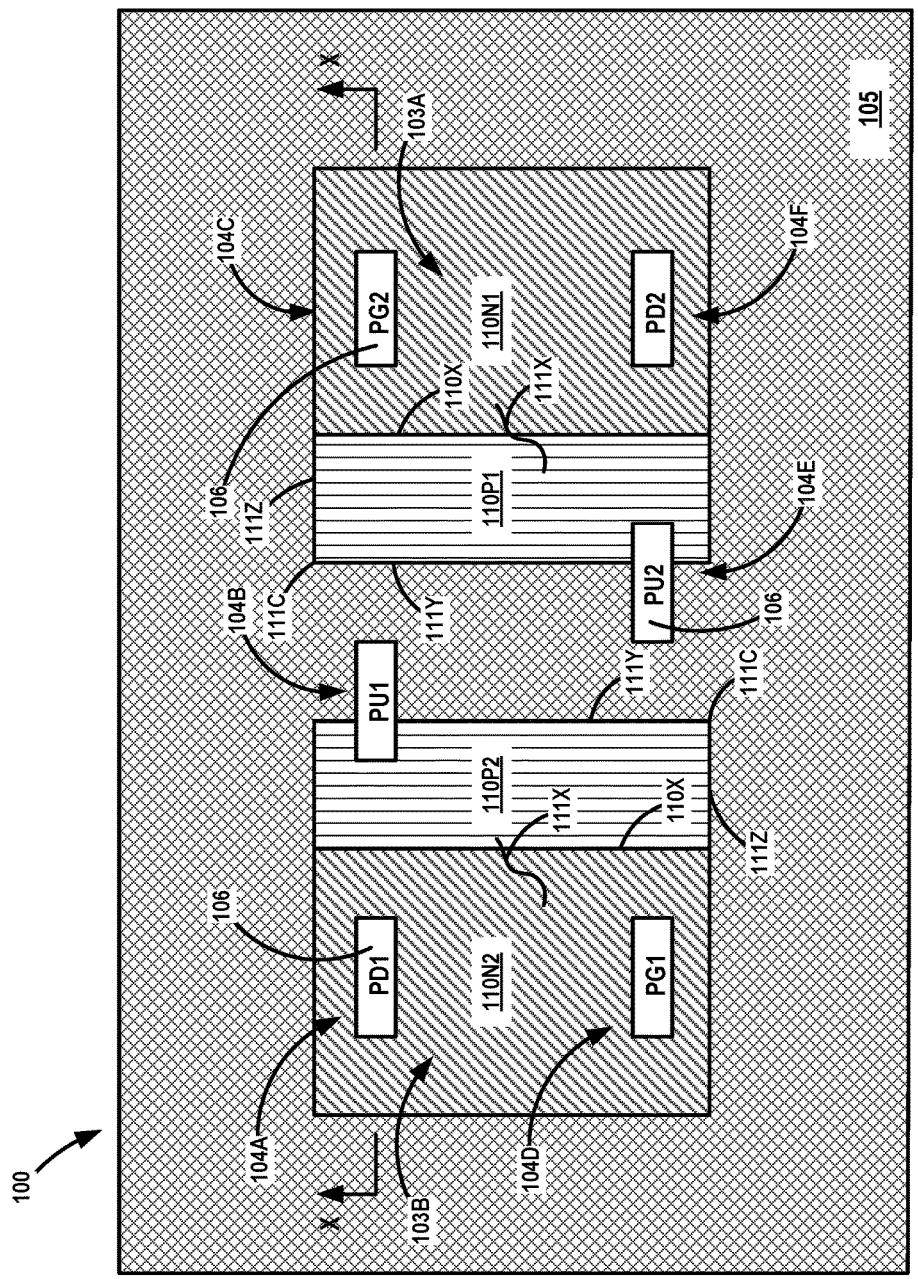

With reference to FIGS. 2 and 3, and as disclosed more fully below, in the examples depicted herein, the transistors 104 are formed above two substantially rectangular-shaped (when viewed from above) merged doped source/drain regions—a first merged doped source/drain region 103A and a second merged doped source/drain region 103B (collectively referenced using the numeral 103). However, the presently disclosed subject matter should not be considered to be limited to any particular form or configuration of the merged doped source/drain regions 103. As shown in FIG. 3, after fabrication is completed, each of the merged doped source/drain regions 103 comprises two oppositely doped regions that engage one another along an interface. More specifically, in the examples depicted herein, the first merged doped source/drain region 103A comprises a first N-doped region 110N1 and a first P-doped region 110P1, while the second merged doped source/drain region 103B comprises a second N-doped region 110N2 and a second P-doped region 110P2. As described more fully below, these N- and P-type doped regions may be formed in a semiconductor material, i.e., either in an epitaxial semiconductor material formed above a semiconductor substrate or in the semiconductor substrate itself. These N- and P-type doped regions are considered to be "merged" since there is no isolation material positioned between the doped regions within a single merged doped source/drain region 103, e.g., the first P-doped region 110P1 directly engages the first N-doped region 110N1 within the first merged doped source/drain region 103A along an interface 110X. With continuing reference to FIG. 3, each of the merged doped source/drain regions 103 has an upper surface 111X (see also, e.g., FIGS. 6 and 7), a first substantially vertically oriented side surface 111Y and a second substantially vertically oriented side surface 111Z. The substantially planar side surfaces 111Y, 111Z intersect one another at a substantially vertically oriented corner 111C. In the depicted example, the corner 111C is formed at a substantially right angle. The doped regions 110N1, 110P1, 110P2 and 110N2 will not be depicted in all of the other plan view drawings so as not to overly complicate the drawings. Several of the drawings herein are cross-sectional drawings depicting the view taken at the location indicated by arrows X-X in FIGS. 2 and 3, i.e., a cross-sectional view taken through the PD1, PU1 and PG2 transistors and the merged source/drain regions 103A, 103B.

Figure 4:
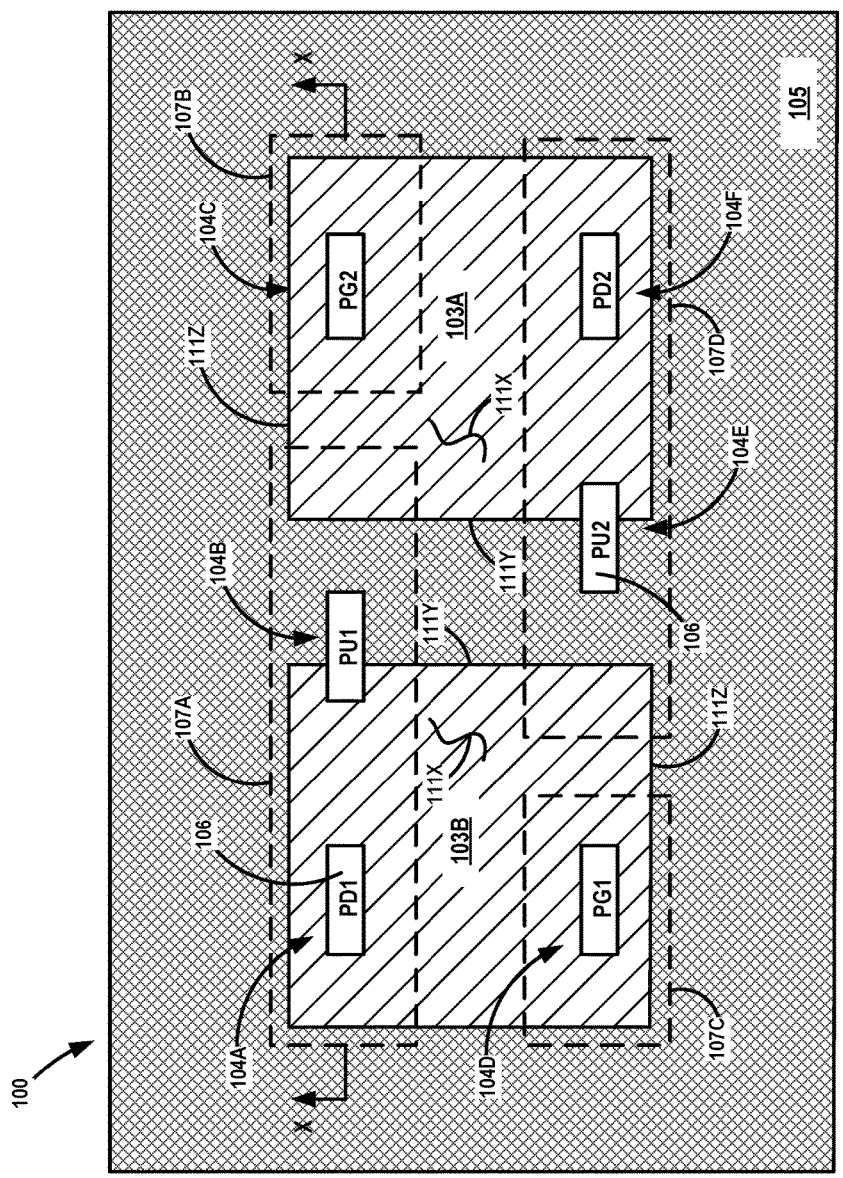

FIG. 4 depicts (in dashed lines) where various separate and discrete conductive gate structures 107A-D (generally referenced using the numeral 107) will be formed for the various transistor devices. The conductive gate structures 107 for the transistor devices 104 may be formed using either gate-first or replacement gate manufacturing techniques. Note that the gate structure 107A will be shared by the PD1 transistor and the PU1 transistor, while the gate structure 107D will be shared by the PD2 transistor and the PU2 transistor. Each of the PG1 transistor and PG2 transistor has their own discrete gate structure 107C, 107B, respectively. Also note that the conductive gate structure 107A extends across the entire width of the second merged doped source/drain region 103B and that it is positioned above only a portion of the first merged doped source/drain region 103A. Similarly, the conductive gate structure 107D extends across the entire width of the first merged doped source/drain region 103A and it is positioned above only a portion of the second merged doped source/drain region 103B.

Figure 5:
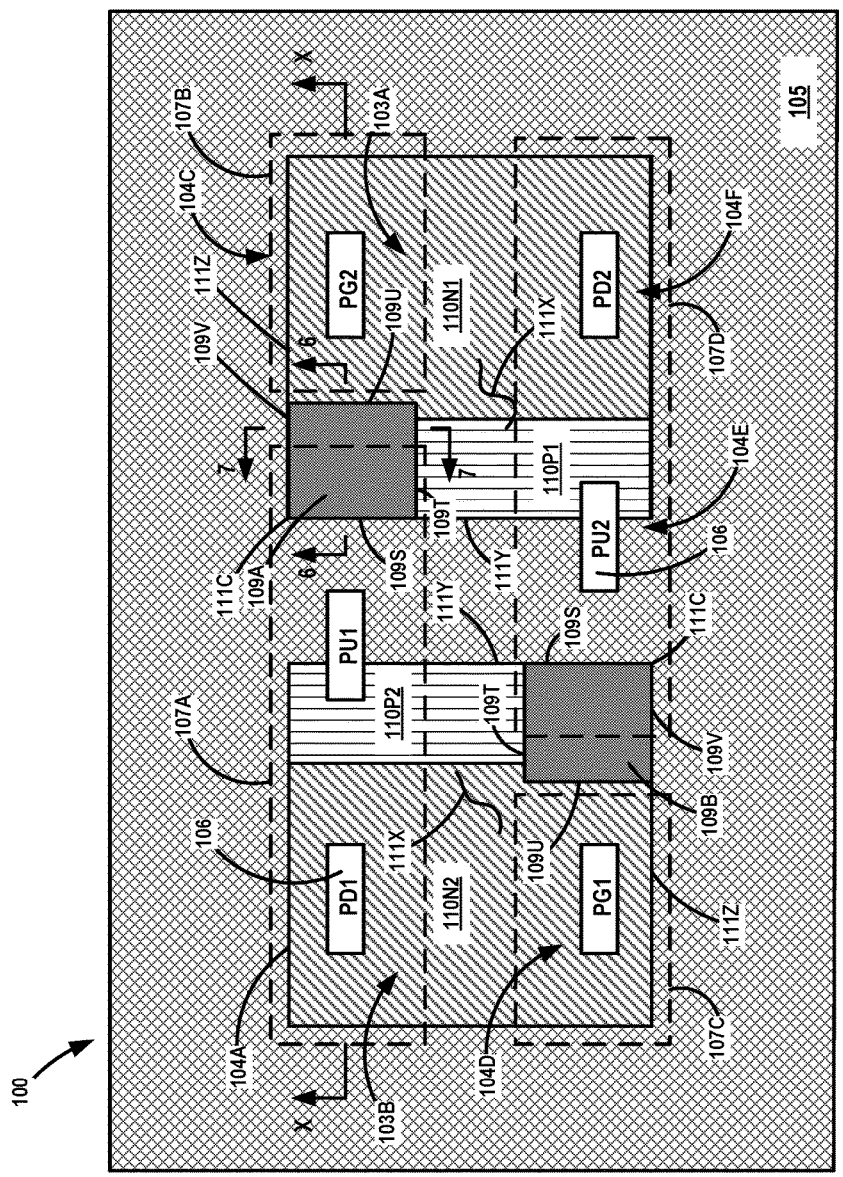

With reference to FIGS. 5-7, for the IC product 100 to function for its intended purpose, the shared gate structure 107A must be conductively coupled to the first merged doped source/drain region 103A, and the shared gate structure 107D must be conductively coupled to the second merged doped source/drain region 103B. Using the methods described more fully below, and as shown in FIG. 5, a first cross-coupled contact structure 109A is formed to conductively couple the shared gate structure 107A to the first merged doped source/drain region 103A, while a second cross-coupled contact structure 109B is formed to conductively couple the shared gate structure 107D to the second merged doped source/drain region 103B. The first and second cross-coupled contact structures 109A, 109B are mirror images of one another and they will be collectively referenced using the reference numeral 109.

FIGS. 6 and 7 depict cross-sectional views of one illustrative embodiment of a contact structure 109 disclosed herein. The views depicted in FIGS. 6 and 7 are taken where indicated in FIG. 5. As noted above, the second contact structure 109B has the same configuration as the first contact structure 109A. In addition to the contact structure 109A, various other structures are depicted in FIGS. 6 and 7: the simplistically depicted conductive gate structures 107A, 107B, a bottom insulating spacer 114, the first merged doped source/drain region 103A (including the doped regions 110P1 and 110N1), an isolation structure 105 (with an upper surface 105X) and a layer of insulating material 127 (e.g., silicon dioxide). In the illustrative examples depicted herein, the contact structure 109A comprises a first portion and a second portion 109H. The first portion of the contact structure 109A is positioned below the upper surface 111X within a contact trench 122 formed in the first merged doped source/drain region 103A. The second portion 109H of the contact structure 109A extends above the upper surface 111X of the first merged doped source/drain region 103A for a given distance. The first portion of the contact structure 109A has a side surface 109S, a side surface 109U, a side surface 109T, a side surface 109V, an upper surface 109X and a bottom surface 109W (see FIGS. 6 and 7). The second portion 109H of the contact structure 109A has a bottom surface 109J that, in one illustrative embodiment, contacts a portion of the upper surface 105X of the isolation structure 105. The second portion 109H of the contact structure 109A conductively contacts the conductive gate structure 107A. The contact structure 109A is electrically isolated from the conductive gate structure 107B by at least the bottom spacer 114 and the insulating material 127.

The first portion of the contact structure 109A disclosed herein is physically engaged with both the P-doped region 110P1 (along the bottom surface 109W of the contact structure 109A) and the N-doped region 110N1 (along at least the side surface 109U of the contact structure 109A—see FIG. 6). In the illustrative examples depicted herein, the contact trench 122 and the contact structure 109A are sized such that the side surface 109U of the contact structure 109A extends past the interface 110X between the doped regions 110P1 and 110N1. Thus, in this particular example, a portion of the bottom surface 109W of the contact structure 109A engages both the P-doped region 110P1 and the N-doped region 110N1.

The various illustrative embodiments of the contact structures 109 disclosed herein provide for a more robust contact structure with a relatively larger contact area, and it affirmatively contacts both the doped regions 110P1 and 110N1 in the first merged doped source/drain region 103A, not only the doped region 110P1—thereby insuring proper contact functionality. The physical dimensions of the contact structures 109 may vary depending upon the particular application. With reference to FIGS. 6 and 7, in one illustrative embodiment, the first or lower portion of the cross-coupled contact structure 109A may extend into the contact trench 122 for a depth 115A of about 5-25 nm, and it may have lateral width dimensions 115B, 115C of about 5-25 nm and about 5-25 nm, respectively. The second portion 109H of the contact structure 109 may extend any desired distance above the upper surface 111X of the first merged doped source/drain region 103A, but it only needs to extend a sufficient distance such that it conductively contacts or engages the conductive gate structure 107A. Although it is not depicted in the simplistic drawing of FIG. 6, a portion of the conductive gate structure 107A may be positioned laterally between the upper portion 109H of the contact structure 109 and the conductive gate structure 107B. Of course, the conductive gate structures 107A and 107B would be electrically isolated from one another by at least some of the insulating material 127.

FIGS. 8-16 are cross-sectional views depicting one illustrative process flow for forming the illustrative vertical transistor devices 104 and the illustrative embodiments of the contact structures 109 disclosed herein. These drawings depict the formation of only the contact structure 109A, as both of the contact structures 109 are mirror images of one another and they will be formed at the same time using the same process flow. Of course, as will be appreciated by those skilled in the art after a complete reading of the present application, the vertical transistor devices 104 disclosed herein may be formed using a variety of different manufacturing techniques and materials, and such transistors 104 may have a variety of different configurations. Moreover, as noted above, the drawings provided herein do not show the full and final formation of functional vertical transistor devices 104. For example, each of the vertical transistor devices 104 would include a top source/drain region (not shown) Thus, the presently disclosed inventions should not be considered to be limited to any particular form of transistor device, its materials of construction or the manner in which it is formed.

The IC product 100 is formed in and above a semiconductor substrate 102. The substrate 102 may have a variety of configurations, such as the bulk substrate configuration depicted herein or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer, wherein the transistor devices 104 are formed in and above the active layer. The active layer and/or the bulk semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials.

Figure 8:
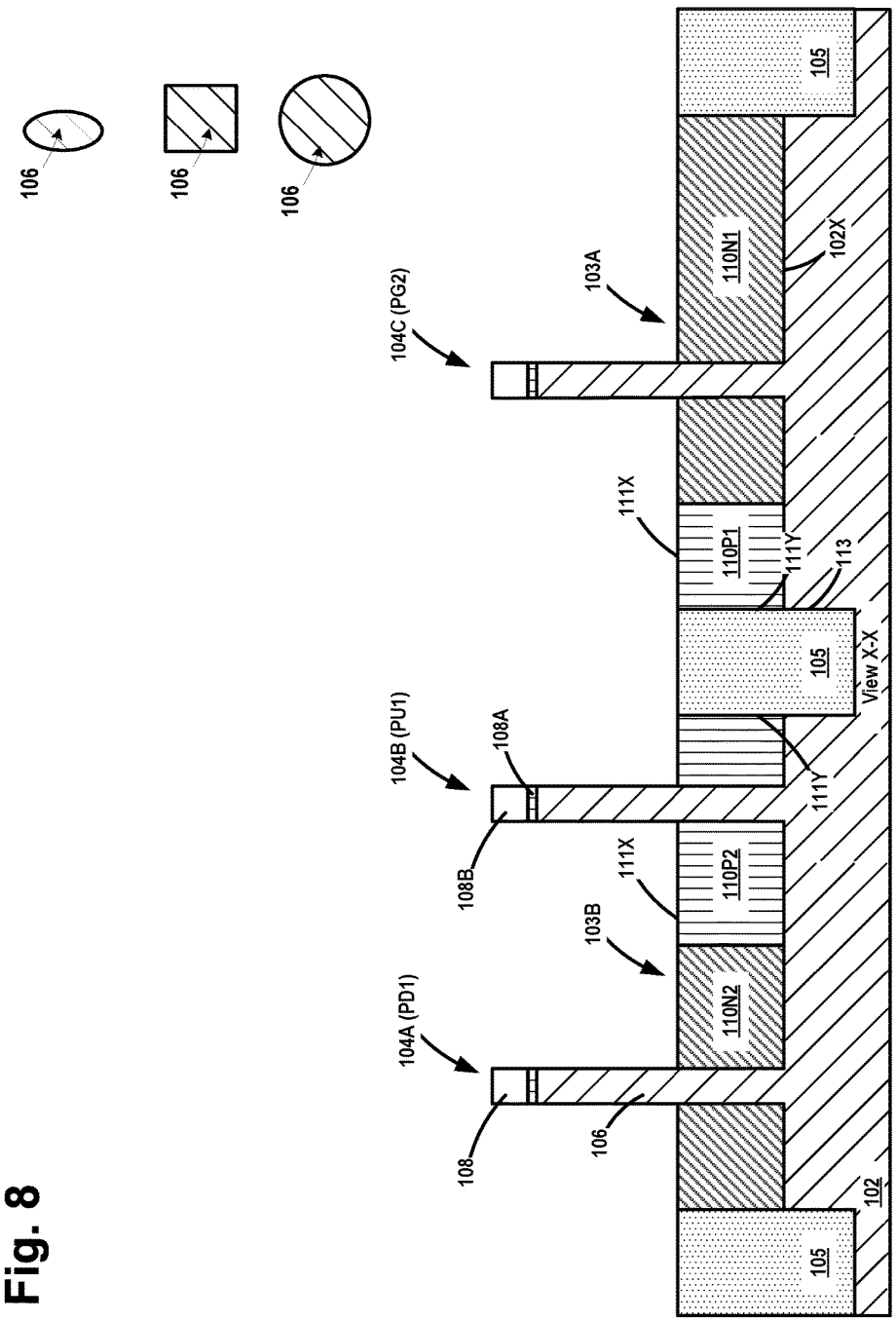

FIG. 8 depicts the IC product 100 after several known process operations were performed. The IC product 100 comprises several structures and components at this stage of processing operations: a plurality of VOCS structures 106, a patterned etch mask 108 (comprised of layers 108A (e.g., silicon dioxide) and 108B (e.g., a layer of silicon nitride)), an isolation structure 105 (e.g., silicon dioxide), a first merged source/drain region 103A (comprised of an N-doped bottom source/drain region 110N1 and a P-doped bottom source/drain region 110P1) and a second merged source/drain region 103B (comprised of an N-doped bottom source/drain region 110N2 and a P-doped bottom source/drain region 110P2). The merged source/drain regions 103 may have a variety of different configurations (when viewed from above) and they may have a substantially planar upper surface 111X. In the illustrative examples depicted herein, the VOCS structures 106 have a substantially rectangular cross-section when viewed from above. In other embodiments, the VOCS structures 106 may have different cross-sectional shapes, such as circle, oval, square, etc., as shown in the upper right-hand portion of FIG. 8. The various structures and regions depicted in FIG. 8 may be formed by performing a variety of different and well-known manufacturing techniques while using a variety of different materials. The isolation structure 105 may also comprise one or more conformal liner layers (not separately shown), such as conformal silicon dioxide and/or silicon nitride liner layers, that were deposited in the isolation trenches 113 prior to overfilling the isolation trench 113 with insulation material.

With continuing reference to FIG. 8, the N-doped source/drain region 110N1 is formed for the N-type transistors PD2, PG2, respectively, in the first merged source/drain region 103A. The source/drain region 110P1 is formed for the P-type transistor PU2 in the first merged source/drain region 103A. The N-doped bottom source/drain region 110N2 is formed for the N-type transistors PD1, PG1, respectively, in the second merged source/drain region 103B. The source/drain region 110P2 is formed for the P-type transistor PU1 in the second merged source/drain region 103B. As mentioned above, a portion of the isolation structure 105 is positioned laterally between the merged doped source/drain regions 103A and 103B. The dopant concentration and depth of the various doped regions shown herein may vary depending upon the particular application. At some point during the process flow, the product may be subjected to at least one anneal process. During that at least one anneal process, dopants from the bottom doped source/drain regions will migrate laterally into the VOCS structures 106, but such migrated dopants are not depicted so as not to overly complicate the drawings.

Figure 9:
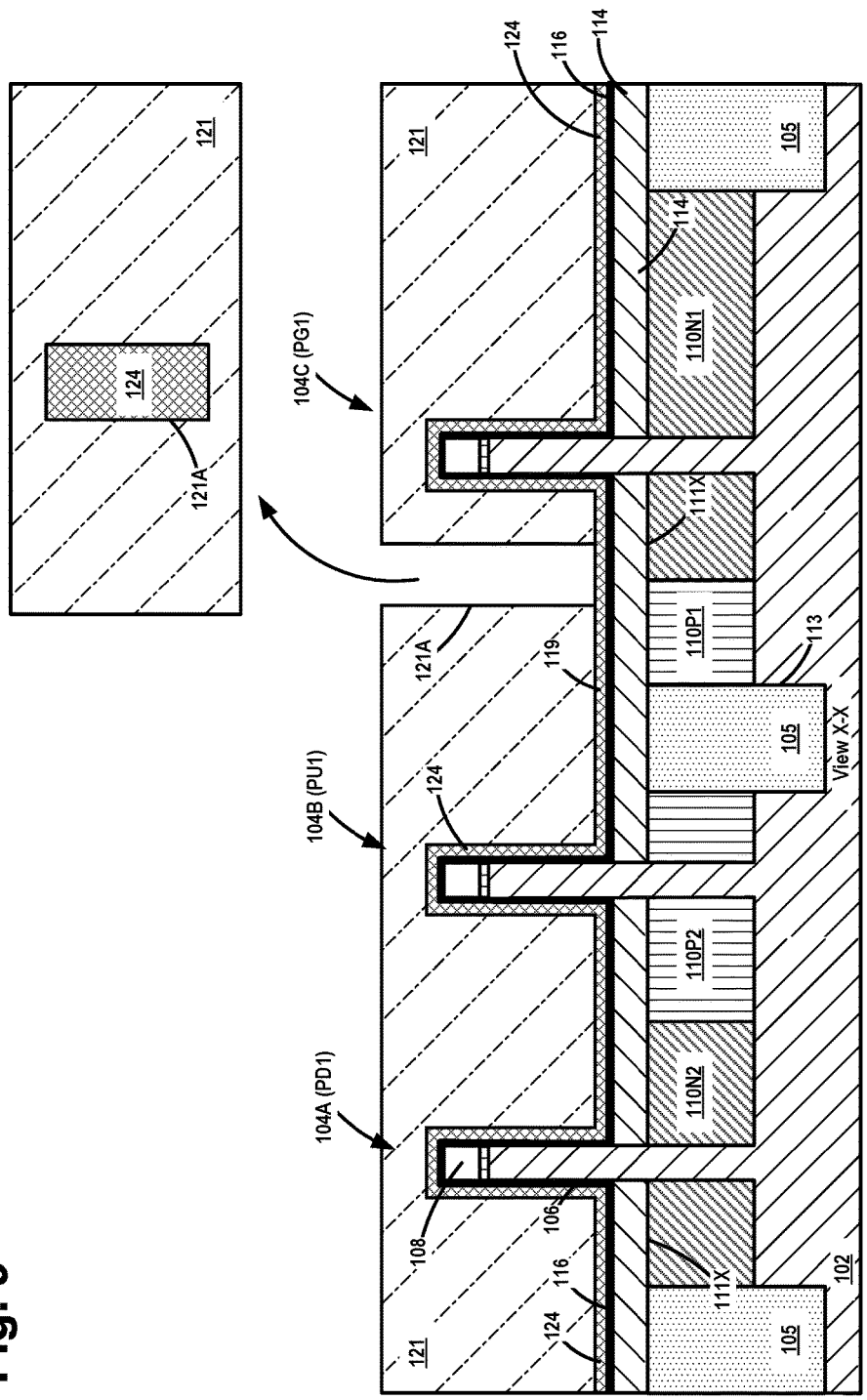

FIG. 9 depicts the IC product 100 after several process operations were performed. First, a continuous layer of bottom spacer material 114 (e.g., a low-k insulating material (k value of 7 or less), silicon dioxide, etc.) was formed above the substrate 102 and around all of the VOCS structures 106 using traditional manufacturing techniques and materials that are well known to those skilled in the art.

In the example depicted herein, a gate-first manufacturing technique was performed to form the conductive gate structures for the transistors 104. Accordingly, still referencing FIG. 9, a conformal deposition process, e.g., an atomic layer deposition (ALD) process, was performed to form a relatively thin (e.g., 1-5 nm) continuous gate insulation (or gate dielectric) layer 116. Then, a continuous conformal layer of conductive gate electrode material 124 was deposited on the gate insulation layer 116 between and around the VOCS structures 106 for all of the transistors 104. Although simplistically depicted as a single layer of material, the layer of conductive gate electrode material 124 may actually be comprised of multiple layers of conductive material. The portion of the layer of conductive gate electrode material 124 positioned above the second merged doped source/drain region 103B will serve as at least part of a conductive gate structure 107A for at least one transistor device (e.g., PD1 and PU1 in the depicted example) formed above the second merged doped source/drain region 103B. The portions of the layer of conductive gate electrode material 124 positioned above the upper surface 111X of the first merged doped source/drain region 103A will serve as at least part of a conductive gate structure 107B for at least one transistor device (e.g., PG1) formed above the first merged doped source/drain region 103A. The layer(s) of conductive gate electrode material 124 may be formed to any desired thickness, and it may be comprised of any desired conductive material, e.g., one or more work function metals, etc. The gate insulation layer 116 may be comprised of a material such as silicon dioxide or a high-k (k value greater than 10) insulating material. In the depicted example, the gate insulation layer 116 is a continuous layer of material. In other applications, such a gate insulation layer 116 may only be formed on the sidewalls of the VOCS structures 106, e.g., in the case where the gate insulation layer 116 is formed by performing an oxidation process.

Also depicted in FIG. 9 is a patterned etch mask 121, e.g., a patterned OPL layer, that was formed above the layer of conductive gate electrode material 124. The patterned etch mask 121 has a plurality of openings 121A (only one of which is shown) that are positioned above portions of the layer of conductive gate electrode material 124 and the gate insulation layer 116 that are to be removed so as to at least partially define the discrete conductive gate structures 107A-D (see FIG. 4). The patterned etch mask 121 was formed using traditional manufacturing techniques and materials that are well known to those skilled in the art, i.e., deposition of the OPL material, patterning of the OPL material using a patterned etch mask (not shown), e.g., a patterned layer of photoresist, etc. As depicted, the opening 121A exposes a portion of the layer of conductive gate electrode material 124. FIG. 9 also contains a simplistic partial plan view depicting the product 100 at this point in the process flow.

Figure 10:
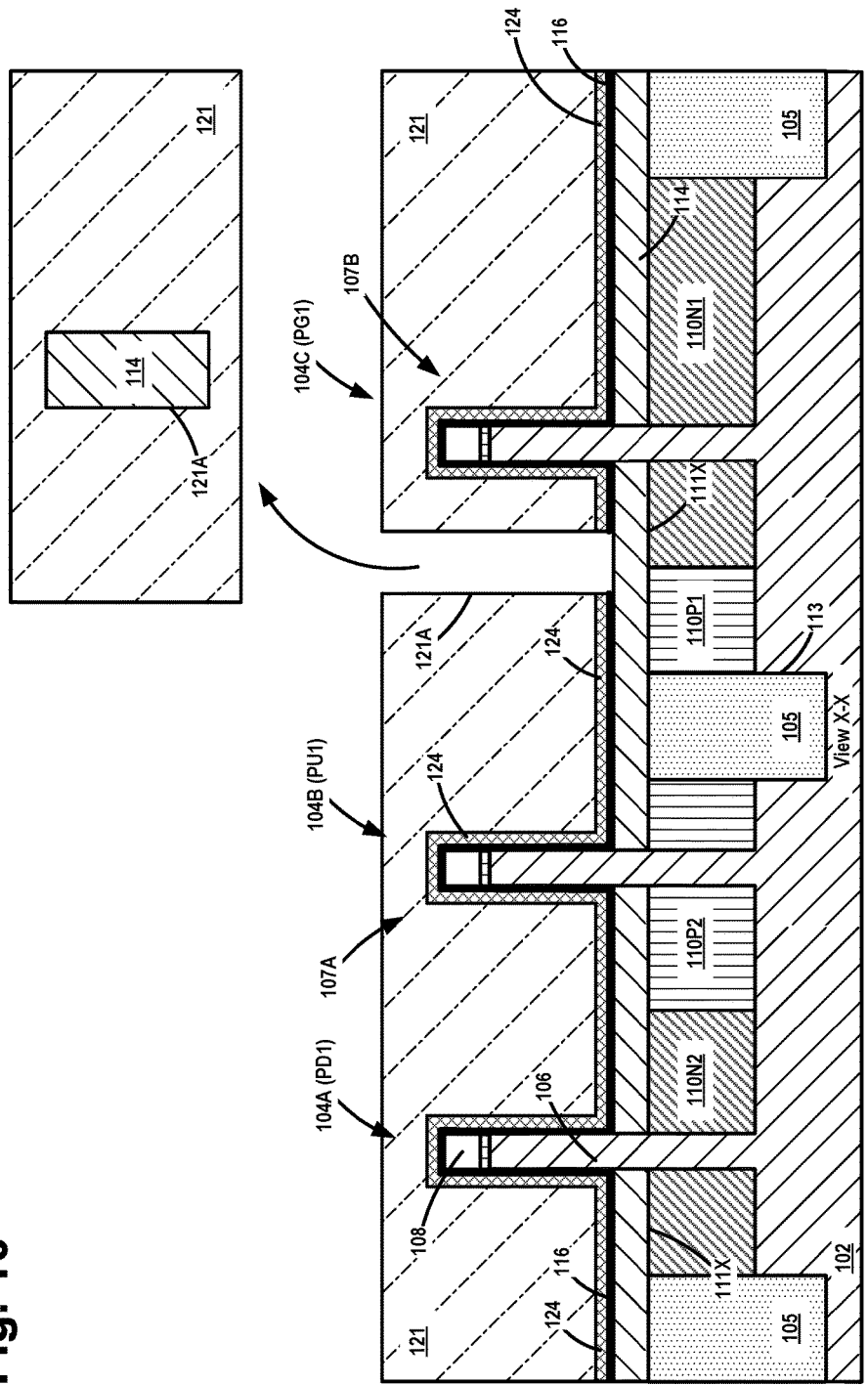

FIG. 10 depicts the IC product 100 after one or more etching processes were performed through the patterned etch mask 121 to sequentially remove the exposed portion of the layer of conductive gate electrode material 124 and the gate insulation layer 116. As depicted, in one illustrative process flow, this process operation exposes a portion of the bottom spacer layer 114. This process operation also at least partially defines the separate conductive gate structures 107A and 107B. Of course, as will be appreciated by those skilled in the art, other process operations may need to be performed to completely form the discrete gate structures 107A-D, such as, for example, additional etching processes, to completely pattern the gate structure or gate electrode material(s).

Figure 11:
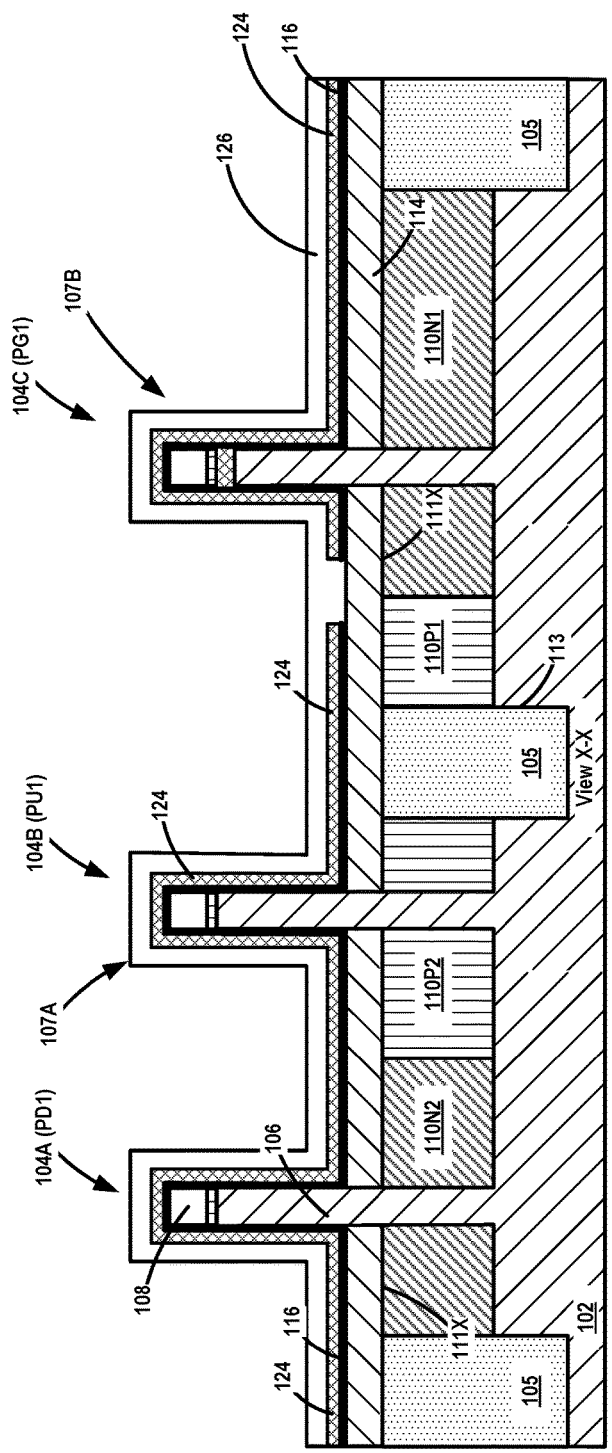

FIG. 11 depicts the IC product 100 after several process operations were performed. First, the patterned etch mask 121 was removed. Thereafter, another conformal deposition process was performed to form a conformal layer of insulating material 126 above the layer of conductive gate electrode material 124. As depicted, the conformal layer of insulating material 126 substantially fills the space between the previously cut gate structures 107A, 107B. The conformal layer of insulating material 126 may be formed to any desired thickness, and it may be comprised of any desired insulating material, e.g., silicon nitride, etc.

Figure 12:
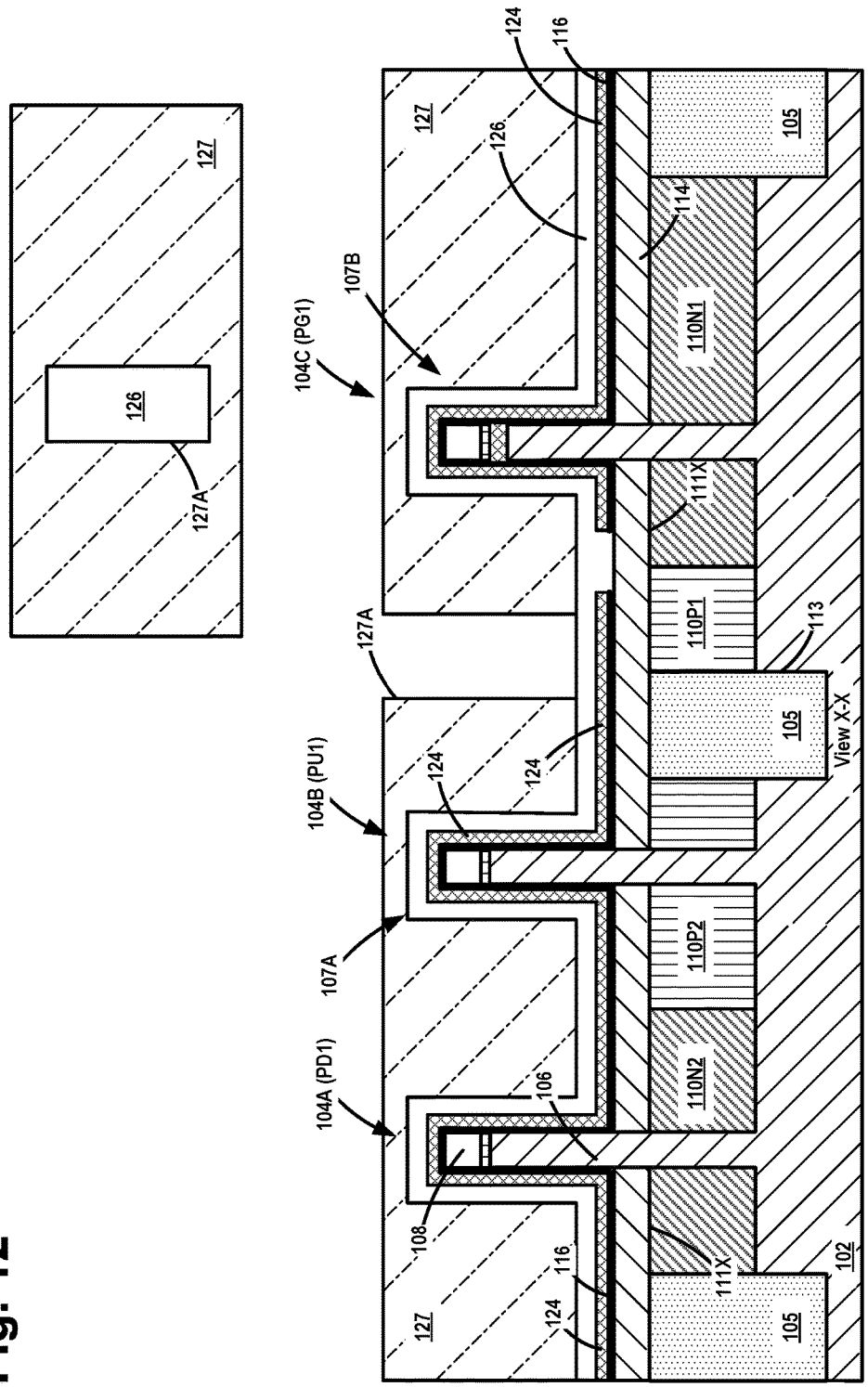

FIG. 12 depicts the IC product 100 after a patterned layer of insulating material 127, e.g., silicon dioxide, a low-k material (k value less than 3.3), etc., was formed above the conformal layer of insulating material 126. The patterned layer of insulating material 127 has a plurality of openings 127A (one for each of the contact structures 109 to be formed in a manner described more fully below) that each have a generally rectangular configuration when viewed from above, as shown in the simplistic plan view included in FIG. 12. The patterned layer of insulating material 127 was formed using traditional manufacturing techniques and materials that are well known to those skilled in the art, i.e., deposition of the insulating material, patterning of the insulating material using a patterned etch mask (not shown), e.g., a patterned layer of photoresist, etc. As depicted, the opening 127A exposes a portion of the conformal layer of insulating material 126.

Figure 13:
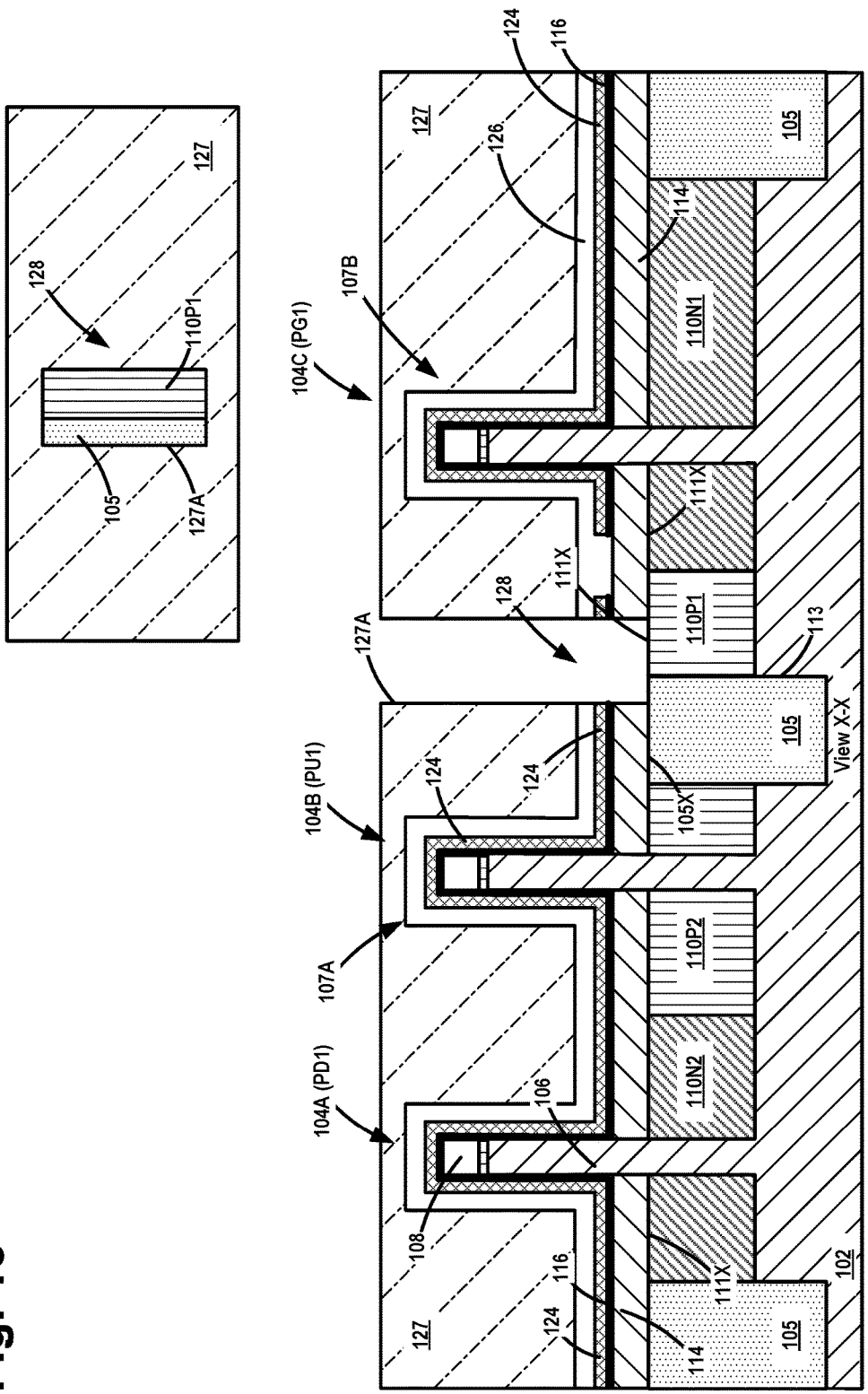

FIG. 13 depicts the IC product 100 after one or more anisotropic etching processes were performed through the patterned layer of insulating material 127 to sequentially remove the exposed portion of the conformal layer of insulating material 126, the layer of conductive gate electrode material 124, the gate insulation layer 116 and the bottom spacer layer 114. As depicted, in one illustrative process flow, this process operation results in an opening 128 that exposes a portion of an upper surface 105X of the isolation structure 105 positioned between the merged doped source/drain regions 103 and a portion of the upper surface 111X of the first merged doped source/drain region 103A. More specifically, in the particular example depicted herein, a portion of the upper surface 111X of the bottom P-doped source/drain region 110P1 is exposed.

Figure 14:
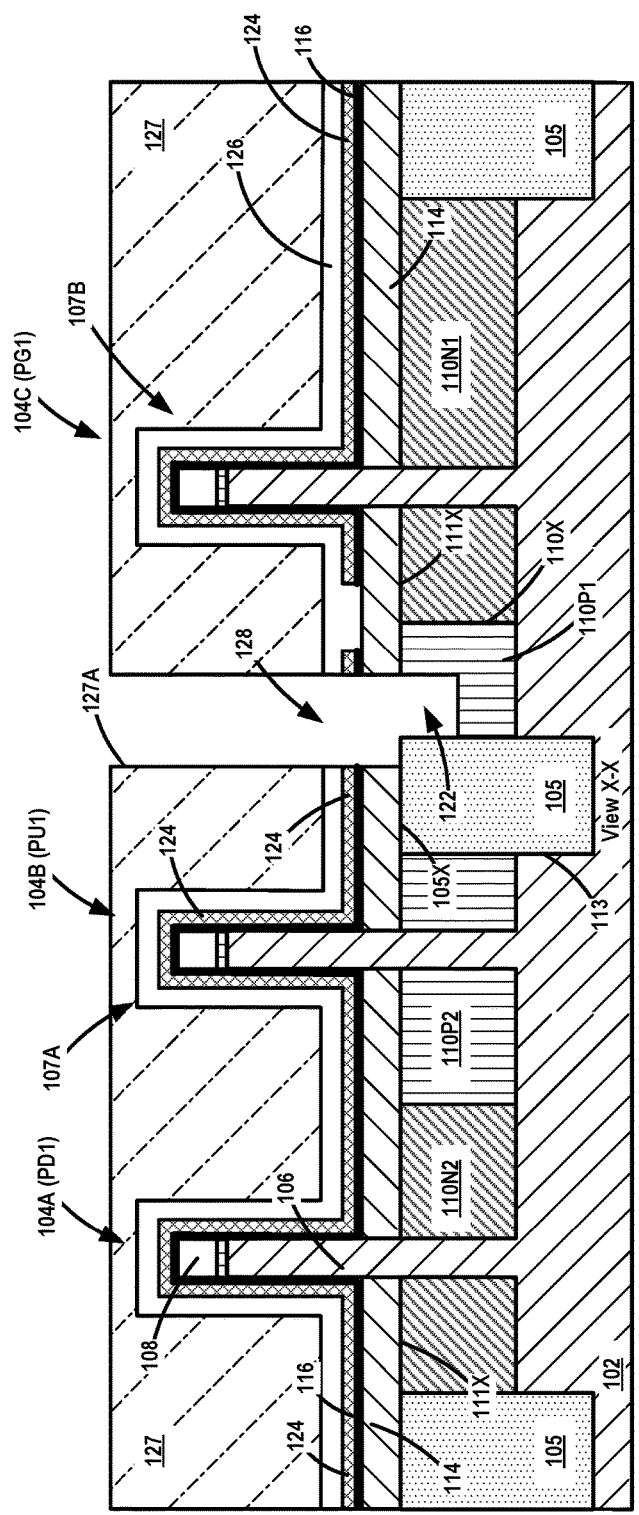
Figure 15:
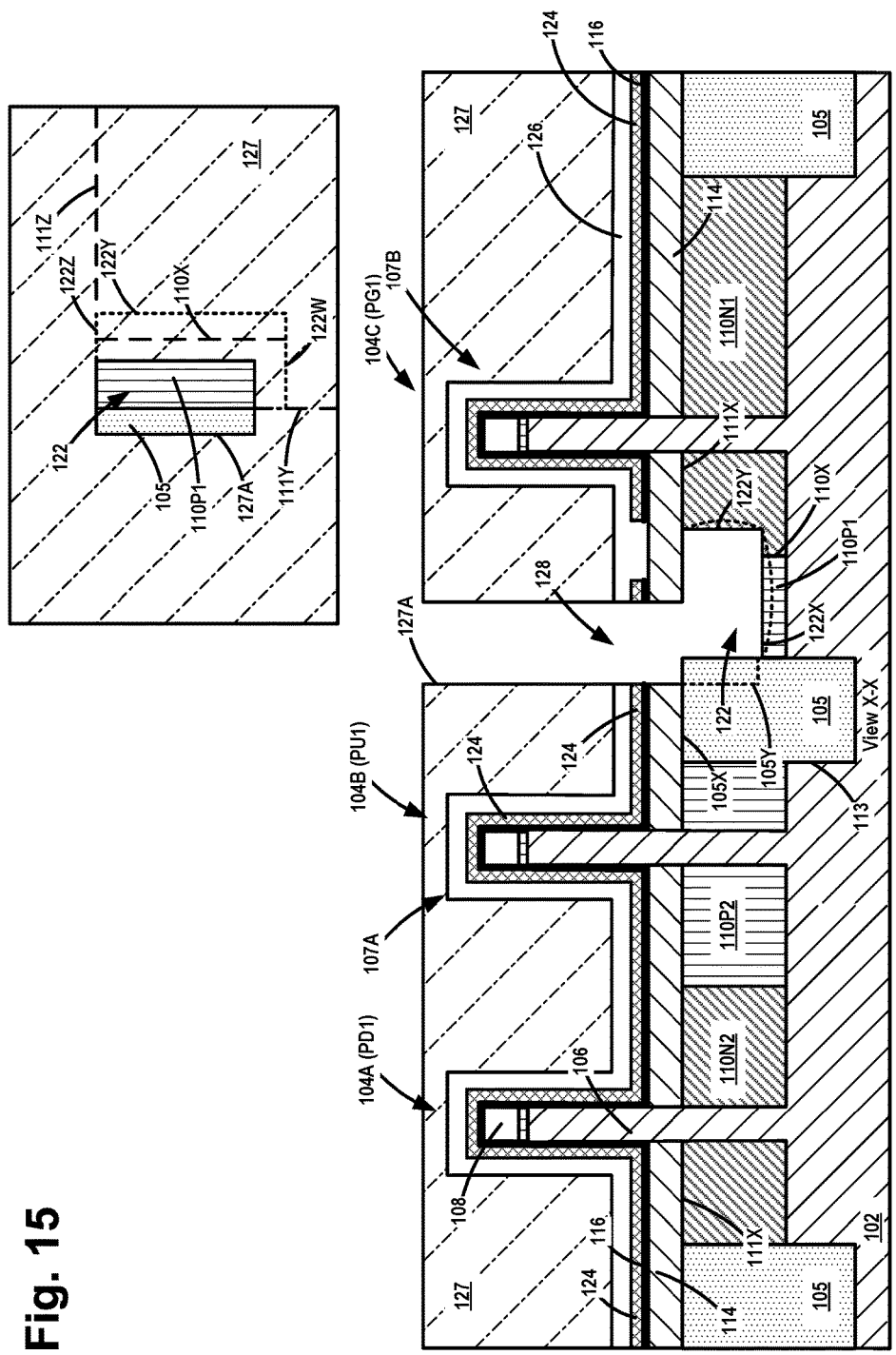

FIGS. 14 and 15 depict one illustrative etching process sequence for forming the contact trench 122 in the first merged doped source/drain region 103A. First, with reference to FIG. 14, a timed anisotropic etching process was performed through the patterned layer of insulating material 127 to remove a first portion of the bottom P-doped source/drain region 110P1 exposed by the opening 128. The vertical depth of the contact trench 122 below the upper surface 111X at the conclusion of the anisotropic etching process operation may vary depending upon the particular application, e.g., 5-10 nm. Then, with reference to FIG. 15, an isotropic etching process was performed to remove additional material from the bottom of the P-doped source/drain region 110P1 that is positioned below the bottom spacer 114 so as to at least expose the N-doped region 110N1. In the example depicted herein, the isotropic etching process was performed in such a manner that portions of the N-doped region 110N1 positioned below the bottom spacer 114 were also removed during the isotropic etching process. This isotropic etching process effectively enlarges the size of the initial portion of the contact trench 122 formed during the anisotropic etching process (shown in FIG. 14) to a larger, final contact trench 122 shown in FIG. 15, with a bottom surface 122X and a side surface 122Y. Although the surfaces 122X, 122Y are depicted as being substantially planar, in an actual real-world device, the surfaces 122X, 122Y may have a non-planar configuration, as simplistically depicted by the dashed lines in FIG. 15. In the examples depicted herein, the contact trench 122 is formed such that its side surface 122Y extends past the interface 110X between the doped regions 110P1 and 110N1, i.e., some of the N-doped region 110N1 is removed during the isotropic etching process. However, in some applications, the final contact trench 122 may be formed in such a manner that its side surface 122Y merely exposes the N-doped region 110N1, i.e., the final contact trench 122 does not extend past the interface 110X. With reference to the simplistic plan view in FIG. 15, the final contact trench 122 has additional side surfaces 122Z and 122W (when viewed from above). In one illustrative example, the side or edge 122Z of the final trench contact 122 may be essentially aligned with the edge 111Z of the first merged doped source/drain region 103A. During the etching processes described above in FIGS. 14 and 15, the isolation structure 105 functions as an etch stop as it is not attacked to any appreciable extent during these etching processes. After formation of the contact trench 122, if desired, metal silicide material (not shown) may be formed on exposed portions of the first merged doped source/drain region 103A within the contact trench 122. In practice, during the process of performing the various etching processes described above to form the contact trench 122, some portion of the isolation structure 105 may also be consumed due to imperfect etch selectivity, as reflected by the dashed line 105Y shown in FIG. 15.

Figure 16:
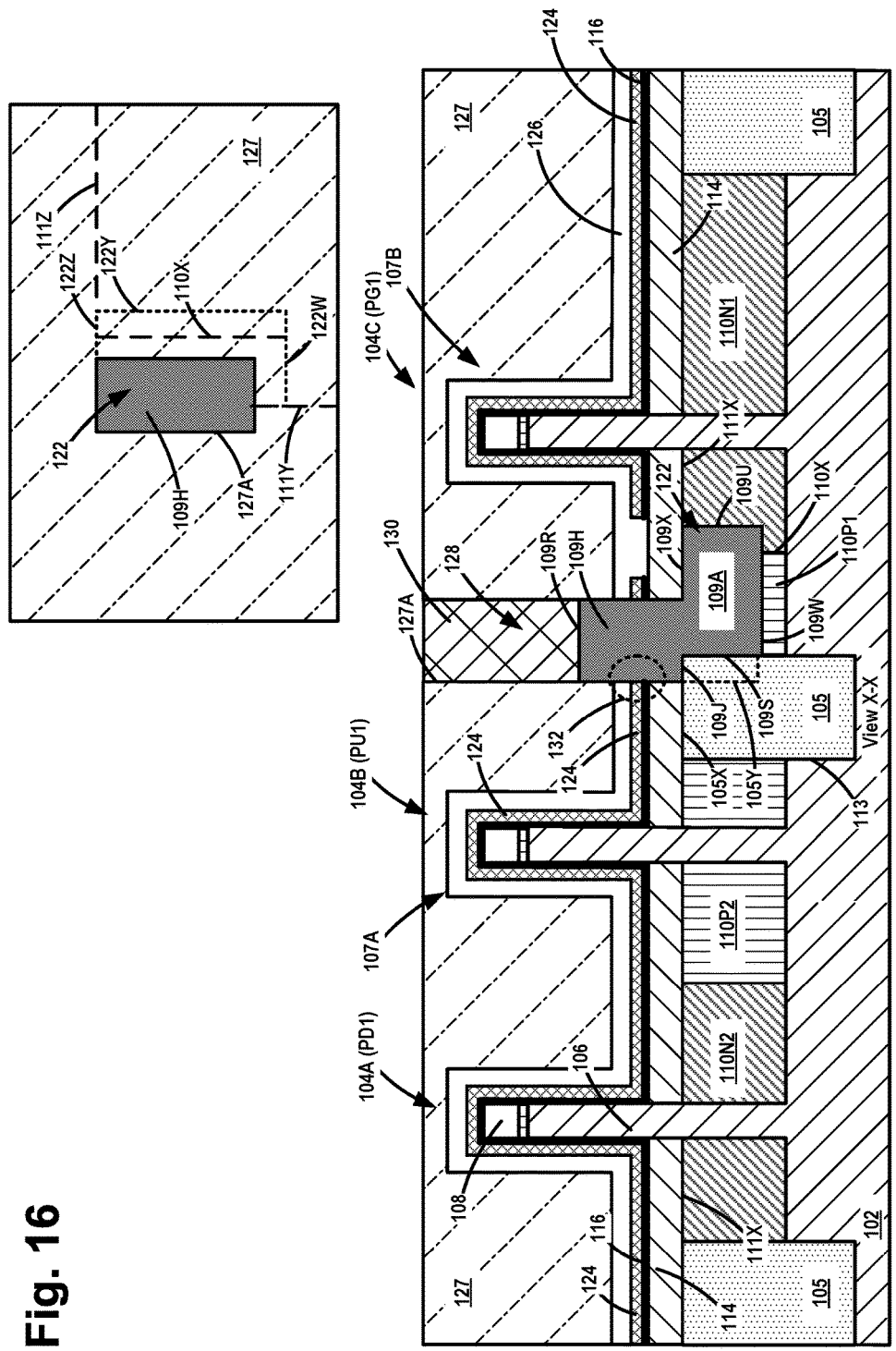

FIG. 16 depicts the IC product 100 after several process operations were performed. First, one or more conductive materials were formed in the contact trench 122 and the opening 128 so as to form the contact structure 109A. As indicated, the upper portion 109H of the contact structure 109A conductively contacts the conductive gate structure 107A in the area indicated by the dashed-line region 132. The contact structure 109A is electrically isolated from the conductive gate structure 107B by at least the bottom spacer 114, the insulating material 126 and the insulating material 127. Thereafter, additional insulation material 130, e.g., silicon dioxide, was formed in the opening 127A above the contact structure 109A. The simplistic plan view in FIG. 16 does not include the insulating material 130.

To form the contact structure 109A, one or more conductive materials may be deposited in the contract trench 122 so as to over-fill the opening 127A. Thereafter, a CMP process or an etch-back process may be performed to remove the conductive material(s) from above the upper surface of the patterned layer of insulating material 127. Then, a recess etching process may be performed to remove a portion of the conductive material(s) from within the opening 127A, thereby resulting in the formation of the contact structure 109A with a recessed upper surface 109R. The contact structure 109A may be made of a variety of different conductive materials, e.g., titanium, etc. At that point, the insulating material 130 may be deposited in the remaining portion of the opening 127A above the contact structure 109A and a CMP process may be performed to remove excess amounts of the insulating material(s) from above the upper surface of the patterned layer of insulating material 127.

After the point of processing depicted in FIG. 16, traditional manufacturing operations may be performed to complete the fabrication of the IC product 100. For example, various conductive contact structures (not shown), such as contact structures to contact other areas of the bottom source/drain regions, may be formed that extend through the layer of insulating material 127. However, since the cross-coupled contact structures 109 disclosed herein would have already been formed and conductively coupled to their appropriate structures, there is no need for a conductive contact to be formed to contact the cross-coupled contact structures 109 disclosed herein. Thus, the cross-coupled contact structures 109 disclosed herein may be considered to be "buried" cross-coupled contact structures 109 as they are positioned under insulating material and there is no need to form a conductive contact structure to the cross-coupled contact structures 109 disclosed herein.

As will be appreciated by those skilled in the art after a complete reading of the present application, there are various embodiments of the illustrative contact structures 109 disclosed herein, as well as various methods of making such contact structures 109. One illustrative IC product disclosed herein includes a first merged doped source/drain region 103A that includes first (110P1) and second (110N1) doped regions that interface with one another within the first merged doped source/drain region 103A and an isolation structure 105 positioned adjacent the first doped region 110P1. In this example, the product also includes a contact structure 109A positioned adjacent the isolation structure 105, wherein the contact structure 109A includes a first portion positioned below an upper surface 111X of the first merged doped source/drain region 103A and a second portion 109H positioned above the upper surface 111X, wherein the first portion physically contacts both the first doped region 110P1 and the second doped region 110N1, while the second portion 109H conductively contacts the gate structure 107A. In this example, the product also includes a layer of insulating material 114 that is positioned on and in physical contact with a portion of an upper surface 109X of the first portion of the contact structure 109A. In some embodiments, only the side surface 109U of the first portion of the contact structure 109A physically contacts the second doped region 110N1. In other embodiments, the first portion of the contact structure 109A comprises a first side surface 109S that physically contacts the isolation structure 105, a second side surface 109U that physically contacts the second doped region 110N1, and a bottom surface 109W that physically contacts both the first (HOPI) and the second (110N1) doped regions. At least part of the second portion 109H of the contact structure 109 is positioned vertically above a portion of the isolation structure 105. In one embodiment, the second portion 109H of the contact structure 109A has a bottom surface 109J that physically contacts an upper surface 105X of the isolation structure 105. In other situations, such as where part of the isolation structure 105 was consumed during the process of etching the contact cavity 122, as reflected by the dashed line 105Y, the lower or first portion of the contact structure 109 would extend into the isolation structure 105. However, even in this latter example, at least part of the second portion 109H of the contact structure 109 would still be positioned vertically above a portion of the isolation structure 105.

One illustrative method disclosed herein includes forming a first merged doped source/drain region 103A in a semiconductor material, the first merged doped source/drain region 103A including first (110P1) and second (110N1) doped regions intersecting one another along an interface 110X within the first merged doped source/drain region 103A, forming a layer of insulating material 114 on and in physical contact with an upper surface 111X of the first merged doped source/drain region 103A and forming an opening 128 in the layer of insulating material, wherein the opening 128 exposes a portion of an upper surface 105X of an isolation structure 105 located adjacent the first doped region 110P1 and at least a portion of the upper surface 111X of the first merged doped source/drain region 103A. In this example, the method also includes forming a contact trench 122 in the first merged doped source/drain region 103A by performing a first anisotropic etching process to remove at least a first portion of the first doped region 110P1 and performing a second isotropic etching process to remove at least an additional second portion of the first doped region 110P1 so as to form the contact trench 122 that at least exposes the second doped region 110N1 positioned under the layer of insulating material 114 and forming a contact structure 109A having a first portion positioned within the contact trench 122 below the upper surface 111X of the first merged doped source/drain region 103A and a second portion 109H that extends above the upper surface 111X of the first merged doped source/drain region 103A, wherein the first portion of the contact structure 109A physically engages both the first (110P1) and second (110N1) doped regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
    a first merged doped source/drain region comprising an upper surface, a first doped region and a second doped region, said first and second doped regions intersecting one another along an interface within said first merged doped source/drain region;
    an isolation structure positioned adjacent said first doped region;
    a contact structure positioned adjacent said isolation structure, said contact structure comprising a first portion positioned below said upper surface of the first merged doped source/drain region and a second portion positioned above said upper surface of the first merged doped source/drain region, wherein said first portion of said contact structure physically contacts both said first doped region and said second doped region; and
    a layer of insulating material positioned on and in physical contact with a portion of an upper surface of said first portion of said contact structure.

2. The integrated circuit product of claim 1, wherein said first doped region is a P-doped region and said second doped region is an N-doped region.

3. The integrated circuit product of claim 1, further comprising:
    a second merged doped source/drain region comprising another first doped region and another second doped region, wherein said another first doped region and said another second doped region intersect one another along an interface within said second merged doped source/drain region, wherein said isolation structure is positioned between said first merged doped source/drain region and said second merged doped source/drain region; and
    a conductive gate structure positioned above at least a portion of said second merged doped source/drain region, wherein said second portion of said contact structure conductively contacts said conductive gate structure.

4. The integrated circuit product of claim 1, wherein said layer of insulating material is a bottom spacer for a vertical transistor device formed in and above said first merged doped source/drain region.

5. The integrated circuit product of claim 1, wherein a bottom surface of said first portion of said contact structure physically contacts both said first and said second doped regions in the first merged doped source/drain region.

6. The integrated circuit product of claim 1, wherein said first portion of said contact structure extends into said isolation structure.

7. The integrated circuit product of claim 1, wherein said first portion of said contact structure comprises:
    a first side surface that physically contacts said isolation structure;
    a second side surface that physically contacts said second doped region; and
    a bottom surface that physically contacts both said first and said second doped regions.

8. The integrated circuit product of claim 1, wherein at least a part of said second portion of said contact structure is positioned vertically above a portion of said isolation structure.

9. The integrated circuit product of claim 1, further comprising a conductive gate structure, wherein said second portion of said contact structure conductively contacts said conductive gate structure.

10. The integrated circuit product of claim 1, further comprising:
    a first N-type pull-down transistor and a first P-type pull-up transistor, both of which are formed above said second merged doped source/drain region;
    a first shared conductive gate structure that is shared by both said first N-type pull-down transistor and said first P-type pull-up transistor; and
    a second N-type pull-down transistor and a second P-type pull-up transistor formed above said first merged doped source/drain region, each of said second N-type pull-down transistor and said second P-type pull-up transistor comprising a drain region, wherein said contact structure conductively couples said first shared conductive gate structure to said drain region of both said second N-type pull-down transistor and said second P-type pull-up transistor.

11. The integrated circuit product of claim 10, wherein said contact structure is a first contact structure, further comprising:
    a first N-type pass gate transistor formed above said second merged doped source/drain region;
    a second N-type pass gate transistor formed above said first merged doped source/drain region;
    a second shared conductive gate structure that is shared by both said second N-type pull-down transistor and said second P-type pull-up transistor; and
    a second contact structure that conductively couples said second shared conductive gate structure to a drain region of each of said first N-type pull-down transistor and said first P-type pull-up transistor thereby forming an SRAM cell.

12. An integrated circuit product, comprising:
    a first merged doped source/drain region comprising an upper surface, a first doped region and a second doped region, said first and said second doped regions intersecting one another along an interface within said first merged doped source/drain region;
    an isolation structure positioned adjacent said first doped region;
    a contact structure positioned adjacent said isolation structure, said contact structure comprising a first portion positioned below said upper surface of the first merged doped source/drain region and a second portion positioned above said upper surface of the first merged doped source/drain region, wherein said first portion comprises:
        a first side surface that physically contacts said isolation structure;
        a second side surface the physically contacts said second doped region; and a bottom surface that physically contacts both said first and said second doped regions; and wherein at least part of said second portion of said contact structure is positioned vertically above a portion of said isolation structure; and a layer of insulating material positioned on and in physical contact with a portion of an upper surface of said first portion of said contact structure.

13. The integrated circuit product of claim 12, further comprising a conductive gate structure, wherein said second portion of said contact structure conductively contacts said conductive gate structure.

14. The integrated circuit product of claim 12, further comprising:

a second merged doped source/drain region comprising another first doped region and another second doped region, wherein said another first doped region and said another second doped region intersect one another along an interface within said second merged doped source/drain region, wherein said isolation structure is positioned between said first merged doped source/drain region and said second merged doped source/drain region; and a conductive gate structure positioned above at least a portion of said second merged doped source/drain region, wherein said second portion of said contact structure conductively contacts said conductive gate structure.

15. A method, comprising:

forming a first merged doped source/drain region in a semiconductor material, said first merged doped source/drain region comprising an upper surface and first and second doped regions that intersect one another along an interface within said first merged doped source/drain region;

forming a layer of insulating material on and in physical contact with said upper surface of said first merged doped source/drain region;

forming an opening in said layer of insulating material, wherein said opening exposes a portion of an isolation structure located adjacent said first doped region and at least a portion of an upper surface of said first doped region of said first merged doped source/drain region;

forming a contact trench in said first merged doped source/drain region by:

performing a first anisotropic etching process to remove at least a first portion of said first doped region; and performing a second isotropic etching process to remove at least an additional second portion of said first doped region so as to form said contact trench that at least exposes said second doped region positioned under said layer of insulating material; and forming a contact structure having a first portion positioned within said contact trench below said upper surface of said first merged doped source/drain region and a second portion that extends above said upper surface of said first merged doped source/drain region, wherein said first portion of said contact structure physically engages both said first and said second doped regions.

16. The method of claim 15, wherein performing said second isotropic etching process also removes a portion of said second doped region so as to form a contact trench that extends into said second doped region, and wherein a bottom surface of said first portion of said contact structure physically engages both said first and said second doped regions.

17. The method of claim 15, wherein forming said contact structure comprises forming said contact structure such that said first portion of said contact structure has a first side surface that physically contacts said isolation structure, a second side surface that physically contacts said second doped region and a bottom surface that physically contacts both said first and said second doped regions.

18. The method of claim 15, wherein forming said contact structure comprises forming said contact structure such that at least part of said second portion of said contact structure is positioned vertically above a portion of said isolation structure.

19. The method of claim 15, further comprising:

forming a second merged doped source/drain region comprising another first doped region and another second doped region, wherein said another first doped region and said another second doped region intersect one another along an interface within said second merged doped source/drain region, wherein said isolation structure is positioned between said first merged doped source/drain region and said second merged doped source/drain region; and forming a conductive gate structure above at least a portion of said second merged doped source/drain region, wherein forming said contact structure comprises forming said contact structure such that said second portion of said contact structure conductively contacts said conductive gate structure.

20. The method of claim 15, further comprising forming a conductive gate structure and wherein forming said contact structure comprises forming said contact structure such that said second portion of said contact structure conductively contacts said conductive gate structure.

* * * * *